United States Patent

Garcia

[11] Patent Number: 5,361,306
[45] Date of Patent: Nov. 1, 1994

[54] APPARATUS AND METHODS FOR ENHANCING AN ELECTRONIC AUDIO SIGNAL

[75] Inventor: Arturo J. Garcia, Miami, Fla.

[73] Assignee: True Dimensional Sound, Inc., Coral Gables, Fla.

[21] Appl. No.: 21,209

[22] Filed: Feb. 23, 1993

[51] Int. Cl.[5] .............................................. H03G 5/00
[52] U.S. Cl. ......................................... 381/98; 381/79
[58] Field of Search ................ 381/79, 86, 98; 455/41

[56] References Cited

U.S. PATENT DOCUMENTS

| | | |
|---|---|---|
| 1,855,054 | 4/1932 | Johnson . |
| 3,243,511 | 3/1966 | Erdman et al. . |
| 3,370,125 | 2/1968 | Shaw et al. . |
| 3,499,988 | 3/1970 | Watanabe et al. . |
| 3,659,056 | 4/1972 | Morrison et al. . |
| 3,985,977 | 10/1976 | Beaty et al. . |
| 4,079,295 | 3/1978 | den Hollander . |
| 4,490,844 | 12/1984 | Sohn . |
| 4,621,203 | 11/1986 | Sweeny . |
| 4,692,852 | 9/1987 | Hoover . |
| 4,734,897 | 3/1988 | Schotz ...................................... 381/86 |
| 5,161,131 | 11/1992 | Borchardt et al. .................... 381/86 |

OTHER PUBLICATIONS

*Basic Electronics*, vol. 1, U.S. Navy Training Pubs., 1971 pp. 168–170 and 258.
*Electrical Fundamentals (Alternating Current)*, Dept. of the Army, 1951, pp. 32–37.

Primary Examiner—Curtis Kuntz
Assistant Examiner—Mark D. Kelly
Attorney, Agent, or Firm—Harold C. Knecht, III

[57] ABSTRACT

Apparatus and methods for enhancing an electronic audio signal by adding enhancing harmonics to the electronic audio signal. The present invention includes a field inducing coil through which input electronic audio signals are to be transmitted to set up an electromagnetic field. The field inducing coil is weakly coupled to an electromagnetic field receptor such that when an input electronic audio signal is transmitted through the inducing coil only a small portion of the electromagnetic field cuts or passes through the field receptor in order to produce an induced electronic audio signal having a greater harmonic content than the input electronic audio signal.

22 Claims, 2 Drawing Sheets

APPARATUS AND METHODS FOR ENHANCING AN ELECTRONIC AUDIO SIGNAL

FIELD OF THE INVENTION

The present invention relates to apparatus and methods for enhancing electronic audio signals in order to improve the quality of sound produced from those signals.

BACKGROUND OF THE INVENTION

Hearing sound, such as music, live has often been considered more pleasurable than hearing the same music after it has been converted into an electronic audio signal and re-converted back into sound (i.e., reproduced sound). There can be many reasons for this perceived drop in quality. One reason resides in the sound reproduction process itself.

Many of the sounds we hear, especially musical notes, are often a composite. For example, a musical note having a basic pitch or fundamental frequency, usually contains other frequency components such as a number of integer multiples of the fundamental frequency called harmonics or overtones. These harmonics create the tonal quality or character (i.e., the timbre) of the note or sound that is often unique to the musical instrument being played, i.e., the sound producing source. In other words, these harmonics enrich the sound we hear. While the human ear typically cannot discern the individual harmonics, it can perceive the presence or absence of these harmonics as an increase or decrease in the quality of the sound, respectively. Equipment for converting live sound into electronic audio signals (e.g., microphones, etc.) typically does not adequately register and convert the full quality of the live sound. That is, the electronic audio signals do not include many of the original harmonics. Numerous sound reproduction systems have been developed in an attempt to add harmonic enhancement to such audio signals. However, these systems are often very sophisticated and expensive and sound produced from such systems may still be perceived to be of a lesser quality than the same sound heard live.

Another reason reproduced sound is often perceived to have a lower quality than live sound can be attributed to the environment in which the sound is produced and recorded. For example, music played in an open field typically sounds one dimensional because much of the sound waves dissipate into the field and are not heard by a listener. On the other hand, music played in an acoustically designed room, i.e., acoustic chamber, usually has a fuller sound and individual sound sources, e.g., musical instruments, are typically more distinguishable, one reason being that the sound heard by the listener includes high quality reverberations.

Not all reproduced sound is originated in an acoustically designed environment and therefore does not contain high quality reverberations. And, even when an acoustically designed environment is used, high quality reverberations which are perceptible by the human ear may get lost in the recording process, for instance if the sound converting equipment (e.g., a microphone, etc.) is unable to register them. In addition, some reproduced sound originates in environments which produce low quality reverberations. Sound reproduction systems have been developed to remove these low quality reverberations. However, in their effort to clean up or remove the unwanted reverberations from the audio signal, desirable or high quality reverberations may be partially or completely removed.

Another problem with reproduced sound, such as music, is that it can become distorted when heard at high volumes. It is often difficult to clearly hear the words being sung in a song or distinguish one musical instrument from another in a piece of music.

An additional problem is that the quality of the reproduced sound can vary depending upon the geometry of the room in which the sound is heard and upon where the listener is located with respect to the source of the reproduced sound (i.e., the speakers). Typically, when this occurs, there will be one or more specific locations of higher quality, often referred to as sweet spots. Thus, in order to enjoy the full potential of such sound reproduction systems, a listener is forced to remain at these sweet spots.

Various systems, a number being very sophisticated and expensive, have been developed in an effort to produce an enhanced electronic audio signal which, when converted into audible sound, is perceived as more closely duplicating the experience of hearing the original live sound. The present invention is an improvement thereon which is relatively inexpensive and simple.

SUMMARY OF THE INVENTION

In accordance with the present invention, methods and apparatus are provided for simply and inexpensively enhancing an electronic audio signal in such a way that the quality of audible sound produced from the audio signal is perceptible as approaching that of the original live sound as if originally heard in an acoustically designed environment. Sound produced from an audio signal enhanced in accordance with the present invention is also less likely to become distorted at high volumes and is a more uniform high quality sound which eliminates, or at least minimizes, the formation of sweet spots.

To these ends, and in accordance with the principles of the present invention, the electronic audio signal is transmitted through a magnetic coil audio energy transfer system which enhances the electronic audio signal in such a way that audible sound produced from the enhanced audio signal is perceptibly richer and fuller. More specifically, the electronic audio signal is electrically driven (i.e., transmitted) through an electromagnetic field inducing coil to generate a field signal correlated to the original electronic audio signal. The field signal is then weakly or loosely coupled to a field receptor member which converts the field signal into an enhanced, but weak, electronic audio signal which may then be amplified, if necessary, for reproduction on conventional audio reproducing equipment such as speakers and the like. With weak or loose coupling, only a small portion of the electromagnetic field set up by the inducing coil cuts or passes through the field receptor.

It is believed that the field inducing coil may be a wire winding with at least one turn, but it is desirable for the field inducing coil to be a winding with a plurality of turns. The field receptor may also be a coil. The inducing and receptor coils may both be mounted to non- or low permeable cores (or a single shared core) such as air or plastic cores by way of example. The receptor may alternatively be a metal wire, plate or tube.

The weak coupling of the induced field signal to the receptor is believed to allow an enhancement to the audio signal, such as by the coil generating missing harmonics of the original audio electronic signal, without inducing undesirable distortion or other undesired effects.

By virtue of the foregoing, there is thus provided a simple and inexpensive apparatus and method for enhancing an electronic audio signal so as to have a quality when aurally reproduced approaching that of original live sound as heard in an acoustically designed environment.

The above and other objectives, features and advantages of the present invention will become further apparent upon consideration of the following description taken in conjunction with the accompanying drawings.

DETAILED DESCRIPTION OF THE INVENTION

Figure 1:
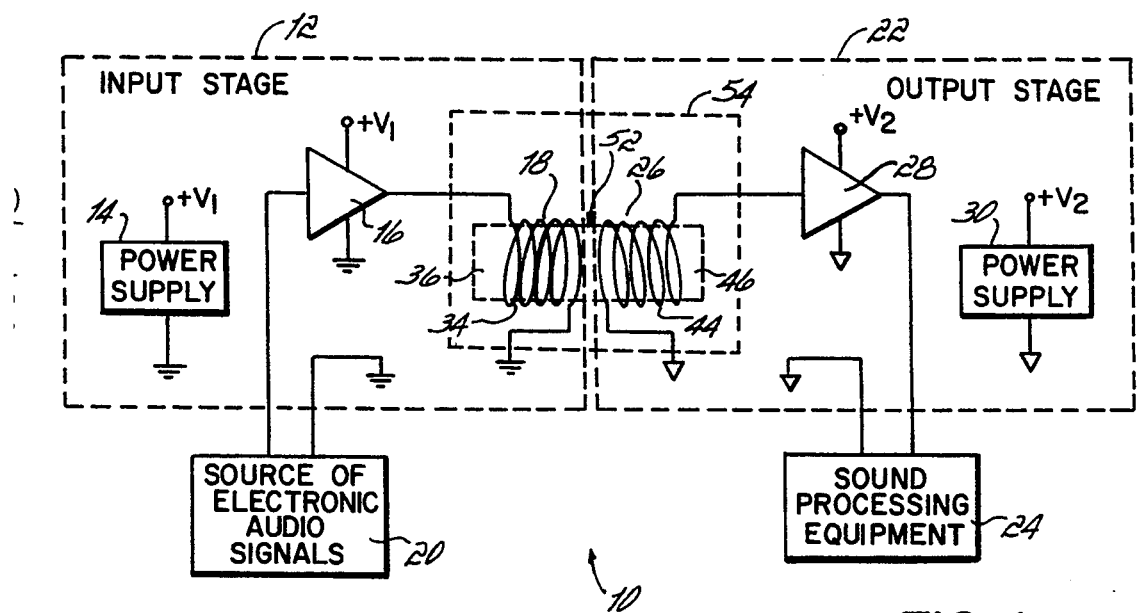
FIG. 1 is a block schematic diagram of an audio signal enhancing apparatus in accordance with the principles of the present invention.

Referring to FIG. 1, there is shown one embodiment of a system 10 for enhancing electronic audio signals according to the principles of the present invention. System 10 includes an input stage 12 having power supply 14, input amplifier 16, and electromagnetic field inducing coil 18 through which multiple frequency electronic audio signals are driven by amplifier 16 to generate a field signal correlated to the original electronic audio signal from a source 20 of electronic audio signals, such as a cassette player, compact disc (CD) player, radio receiver or the like. System 10 also includes an output stage 22 for converting the generated field signals from input stage 12 into enhanced electronic audio signals which may be aurally reproduced into audible sound by conventional sound processing equipment 24 such as speakers, and the like. Output stage 22 includes a field receptor 26 connected to output amplifier 28 which is powered by power supply 30. Field receptor 26 is positioned to receive very weak portions of the field signal created by coil 18 without inducing undesirable distortion and other effects in coil 18.

Input amplifier 16 is a power amplifier which greatly amplifies the electronic audio signal from source 20 to drive the audio signal through coil 18 of input stage 12 with sufficient strength to be received by receptor 26 for conversion into an enhanced electronic audio signal. The original electronic audio signal from source 20 is driven through coil 18 which induces the field signal correlated to the audio signal but, it is believed, including enhancement signals such as missing harmonics. The field signal thus induced at coil 18 is weakly or loosely coupled to field receptor 26 of output stage 22. That is, the receptor 26 is placed within the field created by coil 18 but at a sufficient distance electromagnetically so as to receive the enhanced signals without introducing undesirable distortion and other effects therein. Weakly coupled coil 18 and receptor 26 form a magnetic coil audio energy transfer system 54.

While it is believed that coil 18 may be a single-turn coil of insulated wire 34 wound on a core 36, it is desirable for coil 18 to be a multi-turn coil of wire 34. Field receptor 26 in FIG. 1 is desirably a multi-turn coil of wire 44 with the same number of turns as coil 18. Receptor coil 26 is wound on a core 46 which may form part of the same core as core 36. Receptor coil 26 generates an enhanced electronic audio signal in response to the field from coil 18 but, because of the weak coupling, that generated audio signal is at a very low amplitude compared to the signal driven through coil 18. Consequently, a field signal induced by the generated signal passing through coil 26, if any, is very weak. The output of coil 26 is connected to output amplifier 28 in order to amplify the enhanced signal for use by the subsequent sound reproduction equipment 24.

It will be appreciated that the field signal induced by coil 18 may be weaker for lower frequencies than for higher frequencies. Therefore, the lower frequencies of the enhanced audio signal generated by receptor coil 26 may be weaker than the higher frequency components. In other words, before it is amplified, the high frequency end of the enhanced audio signal has a higher amplitude (i.e., power level) than its low frequency end as compared to the original audio signal driving coil 18. Output amplifier 28 may include a frequency shaping network 109 (see FIG. 3) which favors the low frequencies and attenuates the high frequencies so that the net result is a fairly flat frequency response relative the input audio signal.

Figure 2:
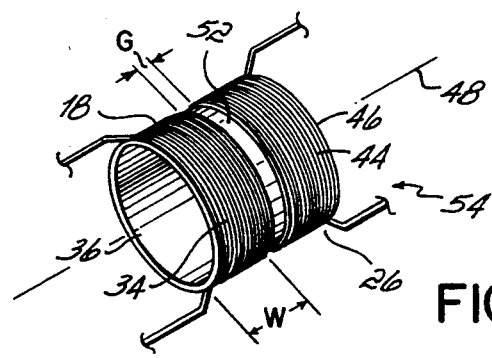
FIG. 2 is a perspective view of one embodiment of the electromagnetic inducer and receptor of FIG. 1.

As seen in FIG. 2, cores 36 and 46 may form part of a single core member 52 such that coils 18 and 26 are coaxial along central axis 48 and spaced apart by a distance G. Although shown as a tube of cardboard with a circular cross-section, core 52 could have other cross-sections, such as rectangular, and may be a solid bar of acrylic or other polymeric material. By being wound on a single core 52, it may be seen that coils 18 and 26 of energy transfer system 54 appear as the primary and secondary, respectively, of a lossy transformer, i.e., the coupling between the coils is deliberately weak so that there is little, if any, actual transformer action between the coils. Rather, coil 26 is believed to act primarily as a receptor of the field induced by coil 18 and is thus positioned relative to coil 18 so as not to introduce undesired distortion to the enhancement of the signal induced by coil 18. The use of low permeability cores is desired and contributes to the weak coupling between the coils as is advantageous in the present invention. Also, by using low permeability core(s), such as with a permeability of approximately 1 or unity, the input and output stages 12 and 22 may be housed together in a relatively small package. Use of higher permeability cores, and perhaps even a ferromagnetic core, may suffice although the spacing between the coils will likely become large to maintain the weak coupling. Additionally, other than a coil, it is believed that receptor 26 may instead be a metallic plate, a length of wire, a tube or other structure which will receive the field induced by coil 18 and convert same to a new and enhanced electronic audio signal.

To enhance operation of system 10, it is desired that the input stage 12 and output stage 22 be well isolated, electrically and electromagnetically (except for the weak field coupling through system 54, such as at the interface of coils 18 and 26). To this end, separate power supplies 14 and 30 are provided in the respective stages 12 and 22, each with a separate ground. Also, each of the power supplies 14, 30 is kept physically remote front both stages 12, 22 or shielded from stages 12, 22 such as with shielding techniques and materials well known in the art.

A typical audio system may include an audio source 20 (such as a cassette tape player) connected directly to sound processing equipment 24 such as a speaker. When that typical system reproduces the sound stored on the cassette tape (not shown) in player 20, there is a certain richness and fullness (i.e., quality) of the sound produced that may be missing compared to the original sound before being recorded. The quality of the audio sound produced by source 20 may be substantially enhanced by introduction of system 10 of the present invention between, for example, tape player 20 and speaker 24. In this regard, the electronic audio signal output from player 20 is connected through input stage 12 and the output of output stage 22 is connected to speaker 24 so as to pass the electronic audio signal through magnetic coil audio energy transfer system 54. When the audio sound from player 20 is heard by a listener (not shown), the quality of sound is enhanced to the point of sounding as if the original performance were being played live and in an acoustically superior environment. Preferably, two systems 10 (i.e., dual channels) are used, one for each respective channel of a stereo sound reproduction system.

One dual channel version of system 10 was built with the following off-the-shelf (i.e., commercially available) electronic components:

(a) Dual Channel Input Amplifier (16)—Realistic S-20 solid state stereo 12 watt amplifier, Model No. 31-B
(b) Two Input Coils (18)—Each a standard speaker coil, rated at 8 ohms and 2 watts
(c) Two Receptor Coils (26)—Each a standard speaker coil, rated at 8 ohms and 2 watts
(d) Dual Channel Output Amplifier (28)—Realistic stereo 1.5 watt pre-amplifier, Model No. 42-2109

The above speaker coils 18, 26 were taken from 3 inch diameter speakers manufactured by the Tandy Corporation, Model No. 40-248. Each winding 18, 26 had a width W (see FIG. 2) of about 0.15 inches, an inside diameter of approximately 0.52 inches, and was formed by two layers of about 30 turns (i.e., about 60 turns total) of magnet wire having a length of approximately 105 inches and a diameter of about 0.005 inches, including its insulation. Each pair of windings 18, 26 were mounted coaxially on a single core 50 of solid acrylic having a rectangular cross section of approximately $\frac{3}{4}$ by $\frac{1}{4}$ of an inch and passing completely through both coils 18, 26. The gap G between the coils 18, 26 was on the order of approximately 0.060 inches. The Realistic amplifiers are also manufactured by the Tandy Corporation. Generally, the degree of amplification of the audio signal from the input amplifier and the optimum gap G between the windings 18, 26 (see FIG. 2) are directly related. For example, with all other variables remaining the same, as the amplification of the audio signal by the input amplifier 16 increases, it is believed that the gap G will eventually need to be increased. As previously noted, the gap G is believed to also vary directly with the permeability of the core 52. This early embodiment of the present invention produced enhanced sound but also exhibited some undesirable characteristics. To overcome these problems, another dual channel embodiment of system 10 was built as now will be described with reference to FIG. 3.

Figure 3:
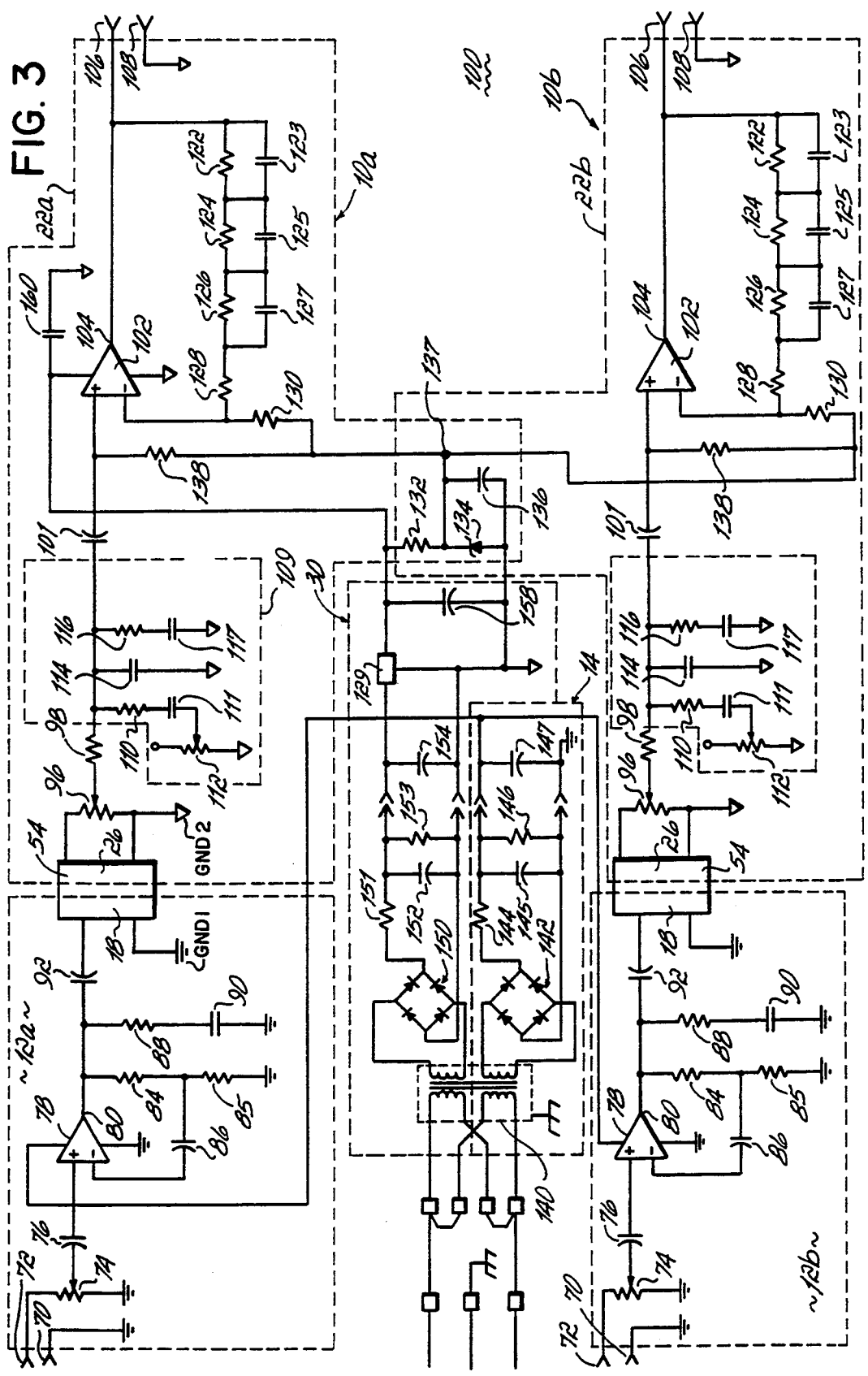
FIG. 3 is a circuit diagram of a stereo or dual channel audio signal enhancing apparatus similar to the apparatus of FIG. 1.

Turning now to FIG. 3, there is shown a detailed schematic illustration of a dual channel or stereo version 100 of system 10 including a left side system 10a and an identical right side system 10b. Systems 10a and 10b share common input stage power supply 14 and common output stage power supply 30 as will be described. The input and output stages 12a, 12b and 22a, 22b of the two systems 10a, 10b are identical and therefore only the circuitry of system 10a will be described in any detail, it being understood that system 10b is the same.

More specifically, input stage 12a includes a first pair of electronic audio inputs 70, 72 connected respectively to the ground (GND1) of power supply 14 and of input stage 12a, and to 10 Kohm potentiometer 74. The wiper of potentiometer 74 is connected via 10 $\mu$F capacitor 76 to the non-inverting input of an LM383 operational amplifier 78. The output 80 of amplifier 78 is fed back to its inverting input from the junction of $\frac{1}{2}$ watt grounded series resistors 84, 85 (200 ohm and 10 ohm, respectively), through 470 $\mu$F capacitor 86. Output 80 of amplifier 78 is further connected to GND1 via the series branch of 1 ohm, $\frac{1}{2}$ watt resistor 88 and 0.2 $\mu$F capacitor 90. Output 80 is next connected to the inducing coil 18 of magnetic coil audio energy transfer system 54 through 2,200 $\mu$F capacitor 92 to drive the electronic audio signal front inputs 70, 72 through coil 18 and induce the field signal as previously described.

Energy transfer system 54 includes field receptor 26 which is connected to a 1 Kohm potentiometer 96, the wiper of which is connected through 10 Kohm resistor 98 and 1 $\mu$F capacitor 101 to the non-inverting input of a LM1458N operational amplifier 102. The coil 18 and receptor 26 are each the same standard 8 ohm, 2 watt speaker coil used in off-the-shelf version of system 10 previously described. Energy transfer system 54, both coil 18 and receptor 26, may be fully encapsulated with a low permeability polymeric potting material. DP-270, a black epoxy potting compound/adhesive manufactured by 3M, St. Paul, Minn., has provided sufficient structural strength and low permeability. Both coils 18 and 26 are potted in their original cylindrical configuration and in the coaxial orientation shown in FIG. 2, with a gap G of approximately 0.025 inches. Output 104 of amplifier 102 is connected to enhanced audio output port 106 which, in cooperation with grounded output port 108, provides the enhanced electronic audio signal to reproducing equipment 24 as previously described. The junction of resistor 98 and capacitor 101 is connected to the output stage power supply ground (GND2) through a shaping circuit 109 comprised of three parallel circuit branches as follows: the series circuit of 5.1 Kohm resistor 110, 0.05 $\mu$F capacitor 111, and open ended 50 Kohm potentiometer 112; 0.002 $\mu$F capacitor 114; and the series circuit of 5.1 Kohm resistor 116 and 0.1 $\mu$F capacitor 117.

The output 104 of amplifier 102 is connected back to its inverting input via the series circuit of: parallel 499 Kohm resistor 122 and 0.005 $\mu$F capacitor 123; parallel 49.9 Kohm resistor 124 and 0.01 $\mu$F capacitor 125; parallel 10.0 Kohm resistor 126 and 0.005 $\mu$F capacitor 127; and 10.0 Kohm resistor 128. The inverting input of output amplifier 102 (as well as the inverting input of the comparable output amplifier in system 10b) is connected to a regulated voltage from regulator 129 of power supply 30 via 1.5 Kohm resistor 130 to the junction of 510 ohm resistor 132 and 5 volt zener diode 134 and 10 $\mu$F capacitor 136 which, at node 137, is at 5 volts. The non-inverting input of output amplifier 102 is similarly coupled to the 5 volt reference 137 via 100 Kohm resistor 138.

With respect to the power supplies 14, 30, a dual transformer 140 provides about 14 volts to the balance of each supply 14 and 30, as will now be described. Input stage power supply 14 includes a diode bridge 142 which produces a full-wave rectified output from one 14 volt output of dual transformer 140. The full-wave rectified output is smoothed (i.e., filtered) by the circuit comprised of 1 ohm, ½ watt resistor 144, 2200 µF capacitor 145, 10 Kohm, ½ watt resistor 146 and 1 µF capacitor 147 to provide a nominal 18 volt unregulated supply and ground (GND1) for each of the input stages 12a and 12b. Similarly, the output stage power supply 30 includes a full-wave rectifier diode bridge 150 connected to the other 14 volt output of dual transformer 140. The output of bridge 150 is smoothed by the circuit comprised of 100 ohm, ½ watt resistor 151, 470 µF capacitor 152, 10 Kohm, ½ watt resistor 153 and 1 µF capacitor 154 to provide a nominal unregulated 18 volts to voltage regulator 129. The output of the voltage regulator 129 is bypassed to ground (GND2) via 10 µF smoothing capacitor 158 and 0.01 µF smoothing capacitor 160 and provides a regulated 12 volt supply and ground (GND2) for each of the output stages 22a and 22b. Capacitor 158 provides filtering for lower frequencies and capacitor 160 provides filtering for higher frequencies. Note that the input amplifiers 78 of each system 10a and 10b have been provided in separate integrated circuit packages and independently powered from supply 14 whereas output amplifiers 102 of each output stage 22a and 22b have been provided in a single integrated circuit package and powered in common from power supply 30.

To prevent interference with the respective audio signals, it is desirable for that portion of power supplies 14, 30 before respective capacitors 147 and 154 to be kept remote from the input and output stages or, as previously discussed, shielded. In addition, the energy transfer system 54, coils 18 and 26, for each channel may also need to be shielded to protect system 54 from any unwanted interference.

In operation, the electronic audio signal for each channel is connected, via a jack or the like (not shown), to the respective input ports 70, 72. As will be appreciated, the electronic audio signal will normally include a wide range of audio frequencies. The respective input levels are adjusted at potentiometers 74 so that the input signal levels of the two channels are about equal and to allow input amplifiers 78 to amplify the input signals to the maximum extent possible without clipping or otherwise distorting the input signals. The audio signals are then enhanced through energy transfer system 54 and the enhanced signals adjusted in level via respective potentiometers 96 and for the desired flat frequency response via respective potentiometers 112 which may also be used to alter the shaping networks 109 somewhat to adjust the tonal quality as desired for the listener. The enhanced audio signals are then amplified by amplifier 102 and connected through outputs 106, 108 (such as by a jack, not shown) to sound reproduction equipment 24, such as another amplifier or speaker system, and is converted into audible sound. Alternatively, equipment 24 may be another recorder of electronic audio signals for recording the enhanced audio signals onto some form of recording medium (e.g., magnetic tape, optical disk, etc.).

While the present invention has been described and illustrated with reference to a number of embodiments, and while these embodiments have been described in considerable detail, it is not the intention of applicant to restrict or in any way limit the scope of the appended claims to such detail. Additional advantages and modifications will readily appear to those skilled in the art. For instance, if music (i.e., electronic audio signals) from a compact disc player is transmitted through system 100 of the present invention and the resulting enhanced electronic audio signal re-recorded onto a cassette tape using a cassette player/recorder, the quality of the music produced from the enhanced electronic audio signal recorded onto the cassette tape has been found to be perceptibly better than the same music produced from the compact disc. This is so even though the compact disc format is widely recognized as producing superior sound quality compared to the cassette tape format. It is envisioned to use an enhancing system according to the present invention to enhance electronic audio signals from sound converting equipment, such as a microphone, etc., before being either recorded onto a recording medium (e.g., magnetic tape, optical disk, etc.) or converted into audible sound.

The invention in its broader aspects is therefore not limited to the specific details, representative apparatus and method, and illustrative examples shown and described. Accordingly, departures may be made from such details without departing from the spirit or scope of the general inventive concept of the present invention.

What is claimed is:

1. An apparatus for enhancing the quality of electronic audio signals comprising:
   an input stage having a field inducing coil through which input electronic audio signals are to be transmitted to set-up an electromagnetic field; and
   an output stage having an electromagnetic field receptor and an output, said field inducing coil and said electromagnetic field receptor being weakly coupled such that when an input electronic audio signal is transmitted through said field inducing coil, only a small portion of the electromagnetic field set up by said inducing coil cuts or passes through said field receptor and an enhanced electronic audio signal is available at said output having an accentuated higher harmonic content compared to that of the input electronic audio signal.

2. The apparatus of claim 1, said field inducing coil being a winding having at least one turn.

3. The apparatus of claim 1, said field inducing coil being a winding having a plurality of turns.

4. The apparatus of claim 1, said electromagnetic field receptor being a winding having at least one turn.

5. The apparatus of claim 1, said electromagnetic field receptor being a winding having a plurality of turns.

6. The apparatus of claim 1, said field inducing coil being a primary winding and said electromagnetic receptor being a secondary winding.

7. The apparatus of claim 6, said windings being supported on at least one low permeability core.

8. The apparatus of claim 7, said at least one core having a permeability of approximately unity.

9. The apparatus of claim 1, said electromagnetic field receptor being at least one from the group consisting of a tube, a length of wire, a coil and a plate.

10. The apparatus of claim 1, said input stage including an input amplifier through which the input electronic audio signal is to be transmitted before being transmitted through said field inducing coil.

11. The apparatus of claim 1, said output stage including an output amplifier through which the enhanced electronic audio signal is to be transmitted.

12. The apparatus of claim 1, said input stage including an input amplifier through which the input electronic audio signal is to be transmitted before being transmitted through said field inducing coil, and said output stage includes an output amplifier through which the enhanced electronic audio signal is to be transmitted.

13. The apparatus of claim 1 including frequency reshaping means for counteracting undesirable frequency shaping caused by said weak coupling.

14. A method of enhancing the quality of electronic audio signals, comprising the steps of:
providing at least one input electronic audio signal;
transmitting the at least one input electronic audio signal through a field inducing coil, thereby setting up at least one electromagnetic field; and
cutting or passing only a small portion of the at least one electromagnetic field through an electromagnetic field receptor to produce a weak coupling and generate at least one enhanced electronic audio signal having an accentuated higher harmonic content compared to that of the input electronic audio signal.

15. The method of claim 14 further comprising the step of:
processing the at least one enhanced electronic audio signal into audible sound.

16. The method of claim 14 further comprising the step of:
recording said at least one enhanced electronic audio signal onto a recording medium.

17. The method of claim 16, said recording medium being magnetic tape.

18. A magnetic tape recording medium having at least one enhanced electronic audio signal recorded thereon by the method of claim 17.

19. The method of claim 16, said recording medium being an optical disk.

20. An optical disk recording medium having at least one enhanced electronic audio signal recorded thereon by the method of claim 19.

21. A recording medium having at least one enhanced electronic audio signal recorded thereon by the method of claim 16.

22. The method of claim 14 including reshaping one or the other or both of the at least one input electronic audio signal and the at least one enhanced electronic audio signal to counteract undesirable frequency shaping caused by the cutting or passing of only a small portion of the at least one electromagnetic field through the field receptor.

* * * * *